(12) United States Patent
Creemers

(10) Patent No.: US 7,046,006 B2
(45) Date of Patent: May 16, 2006

(54) MRI APPARATUS PROVIDED WITH RF COILS HAVING NON-PARALLEL SENSITIVITIES FOR FORMING IMAGES WHILE UTILIZING SUB-SAMPLING

(75) Inventor: Henricus Mathijs Maria Creemers, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 227 days.

(21) Appl. No.: 10/223,995

(22) Filed: Aug. 20, 2002

(65) Prior Publication Data

US 2003/0060699 A1 Mar. 27, 2003

(30) Foreign Application Priority Data

Aug. 22, 2001 (EP) .................. 01203163

(51) Int. Cl.
 *G01V 3/00* (2006.01)
(52) U.S. Cl. ...................... 324/318; 324/309
(58) Field of Classification Search ............... 324/307, 324/309, 318, 319, 322, 300; 600/407, 410
See application file for complete search history.

(56) References Cited

U.S. PATENT DOCUMENTS

| | | | | |
|---|---|---|---|---|
| 5,394,087 | A * | 2/1995 | Molyneaux | 324/318 |
| 5,610,521 | A * | 3/1997 | Zou et al. | 324/318 |
| 5,783,943 | A * | 7/1998 | Mastandrea, Jr. et al. | 324/318 |
| 5,797,396 | A * | 8/1998 | Geiser et al. | 600/407 |
| 6,236,208 | B1 * | 5/2001 | Ham et al. | 324/318 |
| 6,326,789 | B1 * | 12/2001 | Yoshida et al. | 324/318 |
| 6,377,044 | B1 * | 4/2002 | Burl et al. | 324/307 |
| 6,377,045 | B1 * | 4/2002 | Van Den Brink et al. | 324/307 |
| 6,518,760 | B1 * | 2/2003 | Fuderer et al. | 324/307 |
| 6,545,472 | B1 * | 4/2003 | Prussmann et al. | 324/307 |
| 6,556,010 | B1 * | 4/2003 | Van Den Brink et al. | 324/309 |
| 6,577,127 | B1 * | 6/2003 | Harvey et al. | 324/307 |
| 6,593,740 | B1 * | 7/2003 | Van Den Brink et al. | 324/307 |

(Continued)

FOREIGN PATENT DOCUMENTS

EP 1 111 401 A2 6/2001

OTHER PUBLICATIONS

Markus Weiger, et al., "2D Sense for Faster 3D Imaging"; Proceedings of the International Society of Magnetic Resonance Medicine, 8, 2000, p. 152.

(Continued)

*Primary Examiner*—Brij B. Shrivastav
(74) *Attorney, Agent, or Firm*—Thomas M. Lundin

(57) ABSTRACT

The acquisition of MR images while utilizing sub-sampling of the RF signals generated in the patient 21 to be examined is known. Such sub-sampling methods require at least two RF receiving coils which should not have a substantial component of their sensitivity vectors in common. According to the invention at least two coils 22a, 22b are used, a first one (22a) having its sensitivity vector extending substantially transversely of its physical coil plane whereas a second one (22b) has its sensitivity vector extending substantially parallel to its physical coil plane. The coils can thus be placed close to the surface of the patient without interfering with each other. They can be arranged in such a manner that their planes are oriented parallel to the main magnetic field Bo. Moreover, the coils can be arranged so as to overlap substantially, so that they provide the same field of view.

9 Claims, 5 Drawing Sheets

U.S. PATENT DOCUMENTS 6,608,480 B1 * 8/2003 Weyers .................. 324/318
6,879,158 B1 * 4/2005 Zhu ....................... 324/318
6,982,554 B1 * 1/2006 Kurpad et al. .......... 324/318

OTHER PUBLICATIONS

Michael A. Ohliger, et al., "Concentric Coil Arrays for Spatial Encoding in Parallel MRI"; Proceedings of the International Society of Magnetic Resonance Medicine, 9, 2001, p. 21.

J.B. Ra and C. Y. Rim; "Fast Imaging Method Using Multiple Receiver Coils With Subencoding Data Set"; Proc. SMRM 1991.

* cited by examiner

MRI APPARATUS PROVIDED WITH RF COILS HAVING NON-PARALLEL SENSITIVITIES FOR FORMING IMAGES WHILE UTILIZING SUB-SAMPLING

BACKGROUND

The invention relates to an MRI apparatus for forming MR images of a patient to be examined in an imaging volume of the MRI apparatus, which apparatus is provided with:

means for generating a uniform magnetic field in the imaging volume of the MRI apparatus;

a patient support having a longitudinal axis extending in the direction of the uniform magnetic field; and at least two RF receiving coils for receiving RF signals originating from the object, a first one of said RF receiving coils having a sensitivity vector which is directed transversely of the physical plane of said first coil.

An apparatus of the kind set forth is known from a publication in "Proceedings SMRM 1991", p. 1240, entitled "Fast Imaging Method Using Multiple Receiver Coils with Subencoding Data Set". The cited publication describes an imaging method which utilizes magnetic resonance and in which two RF receiving coils are used as the receiving antennas. The known method utilizes the fact that, as a result of the sub-sampling of the acquired magnetic resonance signals, less time is required to sample the k space across a region which is sufficiently large for the desired dimension (field of view) of the magnetic resonance image. More specifically, the respective lines in the k space along which sampling is performed are selected so as to be situated at distances from one another in the k space which are larger than necessary for the desired spatial resolution. One could say: "lines are skipped" in the k space. As a result of such "skipping of lines in the k space", less time is required for the acquisition of the magnetic resonance signals. Receiving coil images are reconstructed on the basis of the sub-sampled magnetic resonance signals from the individual RF receiving coils. Such sub-sampling reduces the actual field of view so that backfolding or aliasing artifacts occur in said receiving coil images. The magnetic resonance image is derived from the receiving coil images on the basis of the sensitivity profiles of the RF receiving coils while eliminating the aliasing artifacts to a substantial degree or even completely from the magnetic resonance image. The magnetic resonance image is thus enlarged to the desired field of view.

An important requirement to be satisfied in eliminating the aliasing artifacts is that only a small degree of interdependence should exist between the sensitivity profiles of the RF receiving coils. The latter is not at all the case for identical receiving coils which fully overlap in space, and is so to a high degree when the planes of said coils extend perpendicularly to one another. The designer and/or user of the system, therefore, will always attempt to arrange the RF receiving coils in such a manner that their position and/or orientation approaches the desired mutual independence of the sensitivity profiles as much as possible.

Another requirement to be satisfied by the RF receiving coils consists in that the sensitivity vector of each RF receiving coil should extend as perpendicularly as possible to the uniform magnetic field in the imaging volume of the MRI apparatus. The above two requirements can be summarized as follows: it is desirable to have mutually independent sensitivity profiles of the RF receiving coils, meaning that the sensitivity vectors do not have a large component in common, and it is also desirable that the direction of said vectors also has a large component in the direction of the uniform magnetic field. Moreover, for a suitable signal yield the RF receiving coils should fit the part of the body of the patient to be imaged as well as possible.

The RF receiving coils in the MRI apparatus described in the cited publication in "Proceedings SMRM 1991" are situated in substantially the same plane, so that the above requirement concerning the small degree of interdependence is not satisfied.

SUMMARY

It is an object of the invention to provide an MRI apparatus for the acquisition of MRI images while utilizing the sub-sampling method, in which apparatus the sensitivity profiles of the RF receiving coils are independent to a high degree and the RF receiving coils suitably fit the part of the body to be imaged.

To this end, the MRI apparatus in accordance with the invention is characterized in that a second one of the at least two RF receiving coils has a sensitivity vector which is directed substantially parallel to the physical plane of said second coil. Coils which have a sensitivity vector which is directed substantially parallel to the physical plane of the coil are known per se; an example of this type of coil is the so-called butterfly coil which is sometimes used in a quadrature combination for the acquisition of conventional (that is, non-sub-sampled) MRI images. The invention is based on the recognition of the fact that a coil of this kind can be advantageously used in combination with a conventional RF receiving coil whose sensitivity vector is directed transversely of its physical plane. When the sub-sampling method is used, each of the two RF receiving coils is connected to its own RF receiving channel and the combining of the images, as required for the removal of said image artifacts, takes place only during the image reconstruction process.

In an advantageous embodiment of the invention the at least two RF receiving coils overlap one another in space. The fields of view of each of the two coils in this embodiment coincide to a high degree, so that the participation of the signals of the two coils in the image forming process is optimum and the signal-to-noise ratio reaches its most attractive value.

In a further embodiment of the invention the MRI apparatus is provided with a switch which is connected to the at least two RF receiving coils and serves to apply the RF signals at option to a quadrature combiner or to a processing device for processing the sub-sampled RF signals so as to form an MR image. This embodiment advantageously utilizes the presence of the RF receiving coils so as to produce, in addition to the sub-sampled MRI images, a quadrature combination for the acquisition of conventional (that is, non-sub-sampled) MR images. Because of the presence of said switch, the operating staff can select one of the two options for the apparatus.

Another embodiment of the MRI apparatus in accordance with the invention is provided with at least two pairs of coils, each of which includes a first coil which has a sensitivity vector which is directed transversely of the physical plane of said first coil and a second coil which has a sensitivity vector which is directed substantially parallel to the physical plane of said second coil, said pairs of coils overlapping one another at least partly in space.

It has been found in the practice of radiology that it is necessary to achieve a substantial further reduction of the time required for the acquisition of the magnetic resonance signals. It has been found that there is notably a need for a substantial reduction of the acquisition time for the magnetic resonance signals in particular for the imaging with a high spatial resolution of fast moving parts of the anatomy, such as a beating heart of the patient to be examined in labor, by means of magnetic resonance imaging methods, but also for MR angiography. The described steps enable the use of a larger number of pairs of coils, each of which has its own signal processing channel so that a proportional further reduction of the acquisition time can be achieved.

A preferred embodiment of the MRI apparatus in accordance with the invention is provided with a tunnel-shaped bore in which the imaging volume is situated and a whole-body RF coil is provided at the area of the wall of the bore, said apparatus being provided with means for forming a first MR image by means of the whole-body RF coil, said apparatus also being provided with means for forming an MRI image which is anatomically identical to the first MRI image by sampling the RF signals received by the at least two RF receiving coils by means of the sub-sampling method, and said apparatus also being provided with means for comparing the mean intensity value of the pixels in a zone of the first MR image with the mean intensity value of pixels in a corresponding zone of the second MR image and for determining, on the basis of said comparison, the sensitivity function of the combination of the at least two RF receiving coils.

This embodiment is particularly attractive for situations where the physical plane of the RF receiving coils can be deformed so as to fit the shape of a part of the body to be imaged, for example, a knee joint. The deformation of the coil changes the sensitivity profile so that the image reconstruction would not be optimum. Because the whole-body RF coil is arranged at the area of the wall of the bore, that is, comparatively far from the imaging volume, the field generated by this coil at the area of the RF receiving coils will be substantially homogenous. This means that the sensitivity profile of this whole-body RF coil has a substantially constant value in this volume. The intensity (gray value) of the images formed by means of the RF receiving coils, however, varies as a function of the distance from the coil because of the decreasing sensitivity profile. In order to correct for this variation, an image can be formed by means of the whole-body RF coil prior to the actual image. This image may be formed with a coarse raster, that is, with large pixels, so that the time required for the acquisition of this image is short. Subsequently, the actual MRI image is formed by means of the RF receiving coils with non-enlarged pixels. When it is ensured that the mean gray value of the pixels in the actual image is made equal to the gray value of the corresponding pixel in the first image, a correction will thus be made for the variation of the sensitivity profile of the RF receiving coils. In other words, the factor required for this correction is the local value of the sensitivity profile of these coils; this profile must be known for the formation of MRI images while utilizing sub-sampling.

DRAWINGS

The invention will be described in detail hereinafter with reference to the Figures.

Therein:

DESCRIPTION

Figure 1:
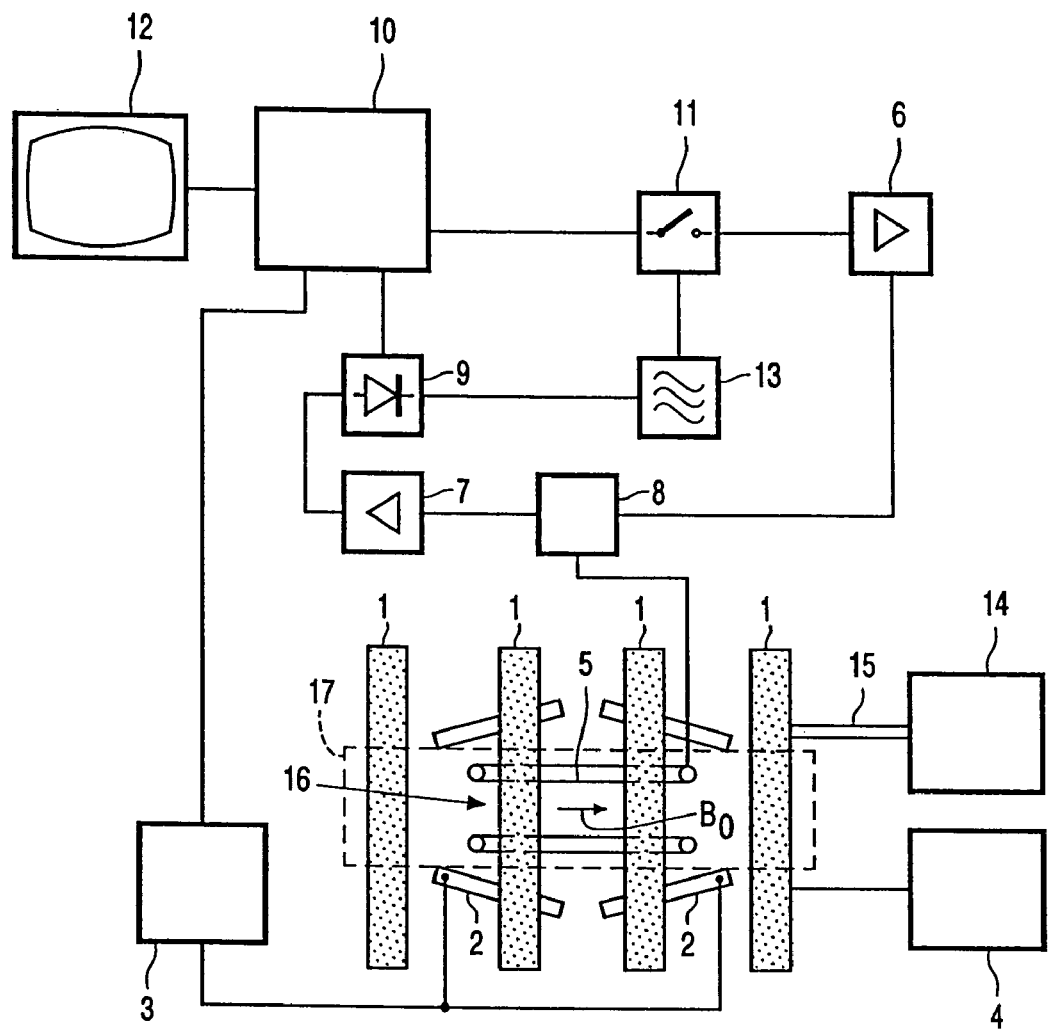
FIG. 1 is a diagrammatic representation of the general construction of a magnetic resonance imaging apparatus which is known per se.

The magnetic resonance imaging apparatus as shown diagrammatically in FIG. 1 comprises means for generating a uniform magnetic field in the imaging volume of the MRI apparatus; such means are formed by a first magnet system 1 for generating a steady magnetic field $B_0$ and a power supply source 4 for the-first magnet system 1. It also concludes a second magnet system 2 (the gradient coil system) for generating magnetic gradient fields and a power amplifier 3 for the gradient coil system 2. A radio-frequency (RF) coil 5 serves to generate an RF magnetic alternating field; to this end, it is connected to an RF transmitter device with an RF source 6. The RF coil 5 can also be used for the detection of spin resonance signals generated by the RF transmission field in an object to be examined (not shown); in that case the RF coil is connected to an RF receiving device which includes a signal amplifier 7 and there is also provided a separating circuit 8 for separating the forward and return signal traffic. The output of the signal amplifier 7 is connected to a detector circuit 9 which is connected to a central control device 10. The central control device 10 also controls a modulator 11 for the RF source 6, the power amplifier 3 and a monitor 12 for image display. An RF oscillator 13 controls the modulator 11 as well as the detector 9 which processes the measuring signals. When the present invention is carried out, however, detection of spin resonance signals generated by the RF transmission field in the object to be examined is realized by utilizing at least two RF surface coils (not shown in FIG. 1), that is, coils which can be arranged directly on the body of the patient to be examined; in that case both coils are connected to the RF receiving device provided with the signal amplifier 7.

A cooling device 14 with cooling ducts 15 is provided for cooling the magnet coils of the first magnet system 1. The RF coil 5 which is arranged within the magnet systems 1 and 2 encloses an imaging volume 16 which, in the case of an apparatus for medical diagnostic measurements, is large enough to receive a patient to be examined or a part of a patient to be examined, for example, the head and the neck. A steady magnetic field $B_0$, gradient fields which select object slices, and a spatially uniform RF alternating field can thus be generated in the imaging volume 16. If desired, the coil 5 may be enclosed by a Faraday cage 17 which shields RF fields.

In order to carry out the present invention the central control device 10 (not separately shown) is provided with sampling means for sampling, using the sub-sampling method, the RF signals received by the RF receiving coils. Such sampling means may be formed by suitably chosen software for the central control device 10. The central control device 10 is also arranged to reconstruct in known manner receiving coil images on the basis of the sub-sampled magnetic resonance signals from the individual RF receiving coils. Such a reconstruction can be carried out by means of suitably chosen software that can be executed by the central control device 10.

Figure 2A:
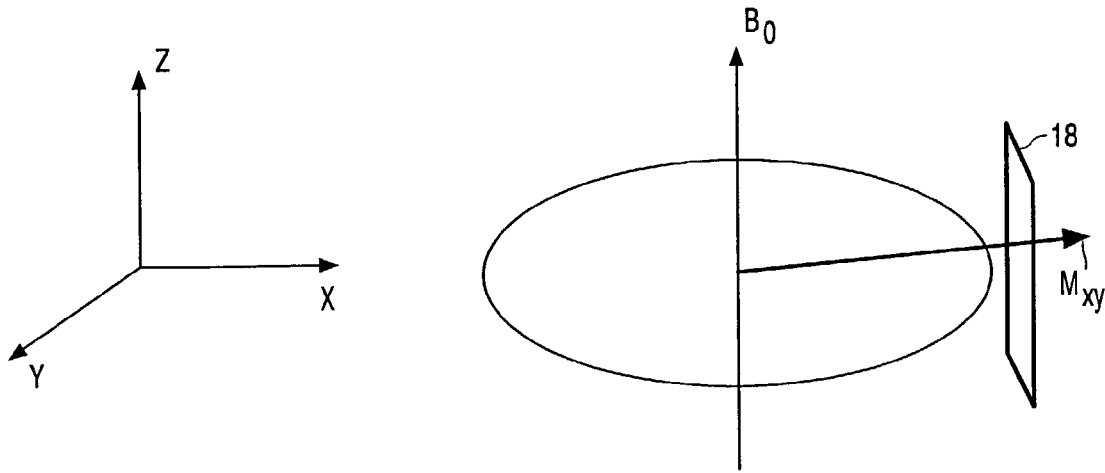
FIG. 2a is a diagrammatic representation of an RF coil in the form of a single loop, that is, in a side elevation.

The FIGS. 2a (side elevation) and 2b (plan view) show how the transverse magnetization $M_{xy}$ of an object which is sensitive to MR (a part of the body of a patient to be examined) performs a precessional motion around the field lines of the $B_0$ field after the RF excitation has stopped. The direction of the field $B_0$ in FIG. 2a extends in the plane of drawing whereas in FIG. 2b this direction extends perpendicularly to the plane of drawing. An RF coil 18 in the form of a single loop is shown in such a manner that its physical plane extends parallel to the direction of $B_0$. The transverse magnetization $M_{xy}$ performs a precessional motion around $B_0$ at the Larmor frequency. In the co-ordinate system shown the total transverse magnetization $M_{xy}$ can be decomposed into its orthogonal components $M_x$ and $M_y$. Generally speaking, surface coils can be configured so as to be sensitive either to one component or to the other component. $M_x$ and $M_y$ are magnetic fields which vary in time and oscillate at the Larmor frequency, that is, with a mutual phase difference amounting to 90 degrees. These components $M_x$ and $M_y$ induce currents in the conductors of surface coils arranged in said fields, said current usually being measured in the form of a voltage difference across a capacitance provided in the relevant coil (not shown in the Figures). It is alternatively possible to measure the voltages induced in the conductors by connecting the input of a preamplifier in series with the relevant conductor; the amplified induced voltage then appears on the output of this preamplifier.

Figure 2B:
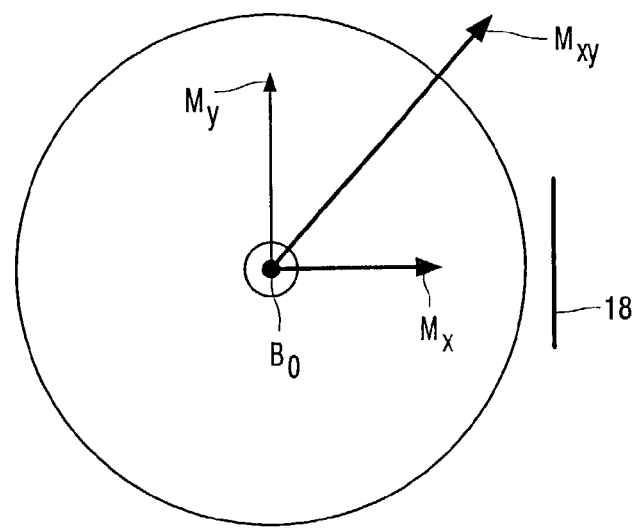
FIG. 2b is a diagrammatic representation of an RF coil in the form of a single loop, that is, in a plan view.

An RF coil in the form of a single loop (single loop coil), such as the coil 18 in the FIGS. 2a and 2b, is sensitive exclusively to magnetic fields which extend perpendicularly to the physical plane of the coil. In the case shown in said Figures the RF coil is sensitive to the $M_x$ component of the precessing magnetization $M_{xy}$. In other words, this case concerns an RF receiving coil which has a sensitivity vector which is directed transversely of the physical plane of this coil. This type of RF coil, often used as a surface coil, is known per se from prior art.

Figure 3A:
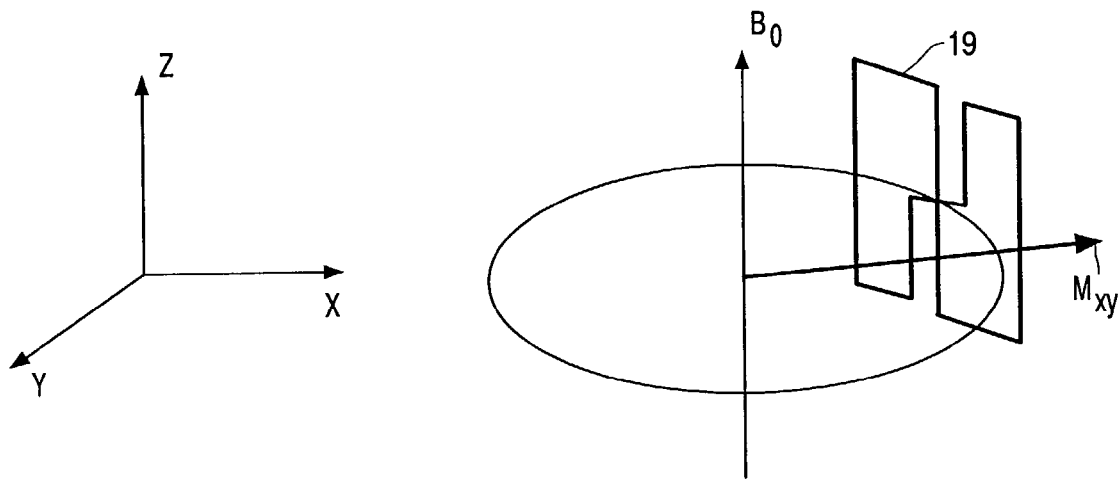
FIG. 3a is a diagrammatic representation of an RF butterfly coil in a side elevation.
Figure 3B:
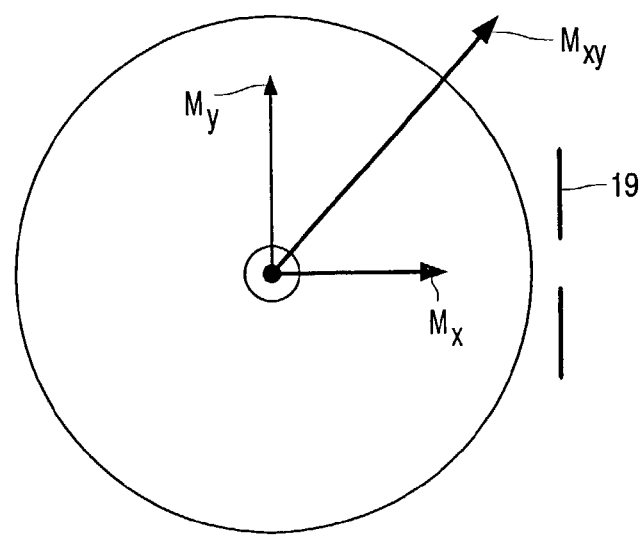
FIG. 3b is a diagrammatic representation of an RF butterfly coil in a plan view.

The FIGS. 3a (side elevation) and 3b (plan view) show a situation which is comparable to that of FIG. 2, be it that FIG. 3 shows a different type of RF coil, that is, a so-called butterfly coil. The butterfly coil 19 is shown in such a manner that its physical plane extends parallel to the direction of $B_0$. An RF butterfly coil of this kind is sensitive to magnetic fields which extend parallel to the physical plane of the relevant coil. In the situation shown in the FIGS. 3a and 3b the butterfly coil 19 is arranged at the area of the single coil 18 of FIG. 2, so that the $M_y$ component of the magnetization $M_{xy}$ can be received by said butterfly coil 19. In other words, this case concerns an RF receiving coil which has a sensitivity vector which is directed substantially parallel to the physical plane of this coil. This type of RF coil is also known per se from prior art.

In conformity with the idea of the invention RF signals can be received simultaneously by means of the two coils 18 and 19, after which the signals of these coils can be combined in a manner which is known per se so that the RF signals received by said coils can be used to reconstruct the desired MRI image by means of the sub-sampling method. In that case it is necessary that the sensitivity vectors of the coils do not have a large component in common; it is notably advantageous when these coils overlap one another in space. In that case their sensitivity vectors extend more or less perpendicularly to one another so that the fields of view of each of the two coils coincide to a high degree. This enables optimum participation of the signals of the two coils in the imaging process, so that the signal-to-noise ratio reaches its most favorable value during the image reconstruction.

Figure 4:
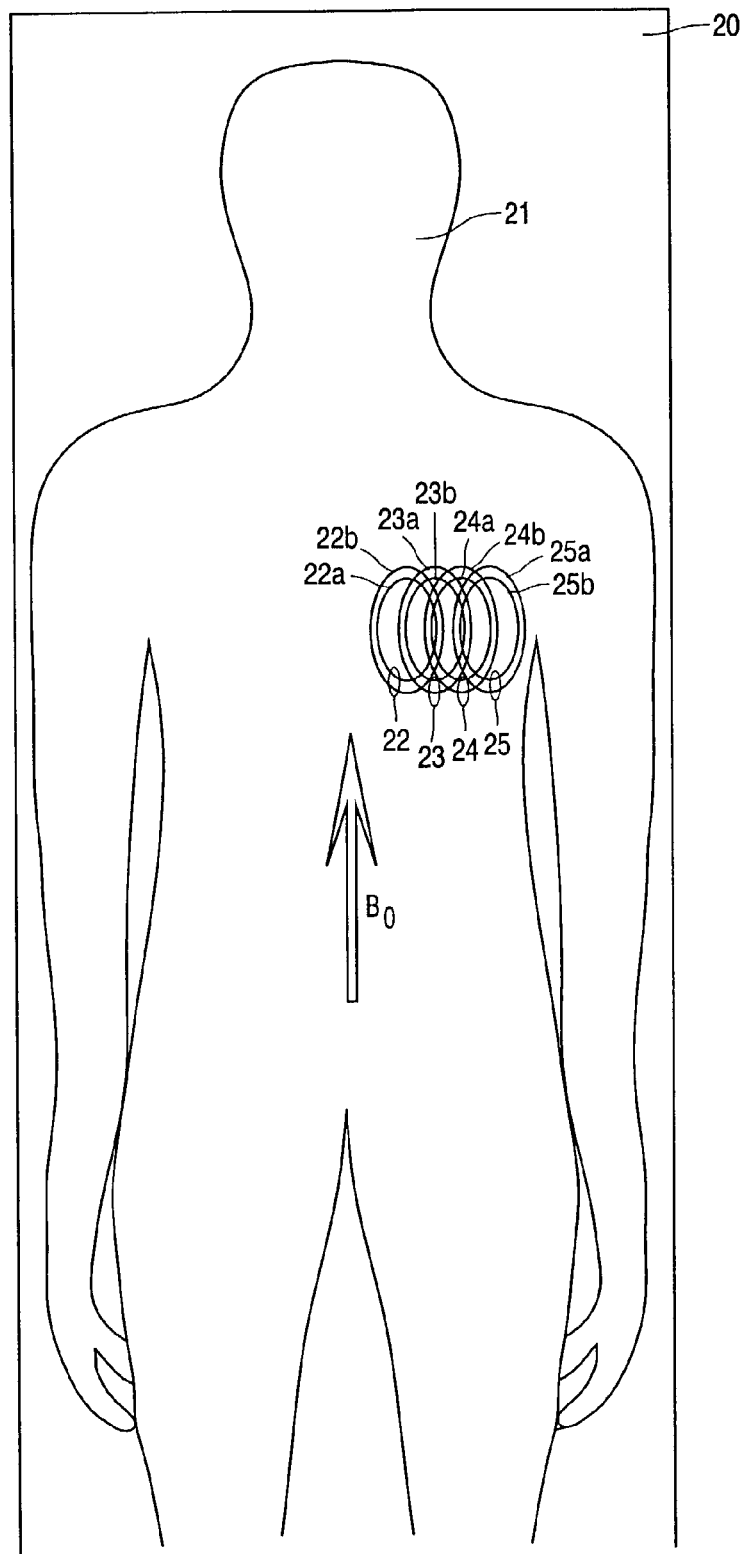
FIG. 4 shows a patient to be examined and a plurality of pairs of RF coils.

FIG. 4 shows a patient to be examined, together with a plurality of pairs of RF coils. The patient 21 to be examined is positioned on a patient support in the form of a table top 20 of a patient table, which table top can be moved into the imaging volume 16 (FIG. 1) of the MRI apparatus. Four pairs of RF coils 22, 23, 24 and 25 are arranged at the area of the heart of the patient. Each pair includes a first RF receiving coil 22a, 23a, 24a and 25a which has a sensitivity vector which is oriented transversely of the physical plane of the relevant first coil, and of a second RF coil 22b, 23b, 24b and 25b which has a sensitivity vector which is oriented substantially parallel to the physical plane of the relevant second coil. The coil pairs 22, 23, 24 and 25 partly overlap one another. Each coil is connected, via connection conductors (not shown), to equipment for the further processing of the RF signals.

It has been found that there is a need for a substantial reduction of the acquisition time required for the magnetic resonance signals, that is, in particular for the formation with a suitable resolution of MR images of, for example, a beating heart of the patient to be examined. When use is made of a plurality of pairs of coils, each pair having its own signal processing channel, a proportional further reduction of the acquisition time is achieved.

Figure 5:
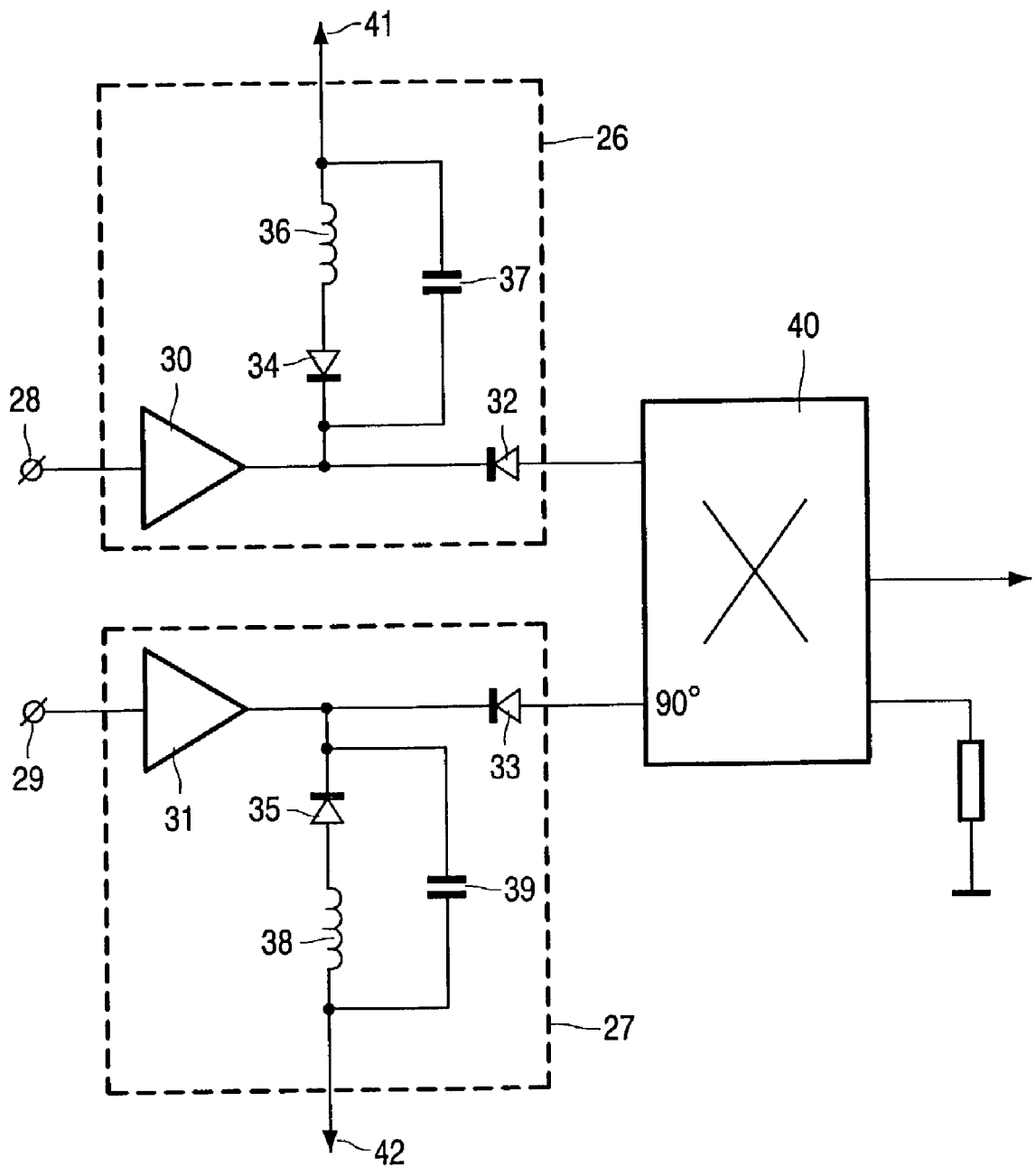
FIG. 5 shows a switch for connection to two RF receiving coils so as to apply the RF signals at option to a quadrature combiner or to a processing device for the processing of the sub-sampled RF signals.

FIG. 5 shows a switch for connection to two RF receiving coils in order to apply the RF signals at option to a quadrature combiner or to a processing device for the processing of the sub-sampled RF signals. The use of this switch enables advantage to be taken of the presence of both types of RF receiving coils (that is, one type with a sensitivity vector which is directed transversely of the physical plane of the coil and one with a sensitivity vector which is directed substantially parallel to the physical plane of the coil) so as to provide, in addition to the sub-sampled MRI images, also a quadrature combination for the acquisition of conventional (that is, non-sub-sampled) MRI images. As a result of the presence of said switch, the operating staff can select one of the two options directly or via a programmed function setting of the apparatus. The switch can be arranged between the outputs of the RF preamplifiers, connected to the RF coils, and the inputs of the quadrature combiner required for the quadrature mode.

It is assumed that the switch of FIG. 5 is connected to one RF butterfly coil and to one RF coil in the form of a single loop. The switch in accordance with FIG. 5 comprises two branches 26 and 27, each of which constitutes an input for one of said RF coils; for example, the butterfly coil is connected to the input 29 and the single loop is connected to the input 28. The inputs 28 and 29 also constitute the inputs of the RF preamplifiers 30 and 31, respectively. The outputs of the preamplifiers 30 and 31 are connected on the one side to a pin diode 32, 33, respectively, and on the other side to a series connection of a pin diode 34, 35 and an inductance 36, 38, respectively, a capacitance 37, 39, respectively, being connected parallel to said series connections. The anodes of the pin diodes 34 and 35 constitute the outputs of the switch which apply the RF signals to a processing device (not shown) for the processing of the sub-sampled RF signals so as to form an MR image. The anodes of the pin diodes 32 and 33 constitute the outputs of the switch which apply the RF signals to the quadrature combiner which outputs a combined RF signal for the further processing of the quadrature signals so as to form an MR image.

The operation of the switch is as follows. When the anodes of the four pin diodes 32, 33, 34 and 35 are rendered DC positive relative to the associated cathodes (via a control circuit which is not shown), said diodes become conductive. The LC combinations 36, 37 and 38, 39, however, are proportioned in such a manner that in the presence of conductive diodes 34 and 35 they exhibit parallel resonance for the relevant RF frequency, so that the RF signal is not conducted to the outputs 41 and 42 via the branches 26 and 27, respectively; in that case the RF signal is applied to the quadrature combiner 40 via the diodes 32 and 33. When the anodes of the four pin diodes 32, 33, 34 and 35 are rendered DC negative relative to the associated cathodes, said diodes enter the blocked state. In that case the RF signal cannot be conducted to the quadrature combiner 40 via the diodes 32 and 33. When the diodes 34 and 35 are in the blocked state, the capacitances 37 and 39 constitute, because of their proportioning, a conductive path for the RF signals. These signals are thus conducted to the outputs 41 and 42 wherefrom they can be applied to a processing device for the processing of the sub-sampled RF signals.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. An MRI apparatus for forming MR images of a patient to be examined in an imaging volume of the MRI apparatus, the MRI apparatus comprising:
   means for generating a uniform magnetic field in the imaging volume of the MRI apparatus;
   a patient support having a longitudinal axis extending in the direction of the uniform magnetic field;
   at least two RF receiving coils for receiving RF signals originating from the patient, a first one of said RF receiving coils having a sensitivity vector which is directed transversely of the physical plane of said first coil; and
   a sampling device for the sampling in a sub-sampling fashion of the RF signals received by the RF receiving coils, wherein
   a second one of the at least two RF receiving coils includes a sensitivity vector which is directed substantially parallel to the physical plane of said second coil.

2. An MRI apparatus as claimed in claim 1, wherein the at least two RF receiving coils overlap one another in space.

3. An MRI apparatus as claimed in claim 1, the apparatus further comprising a switch which is connected to the at least two RF receiving coils and serves to apply the RF signals at option to a quadrature combiner or to a processing device for processing the sub-sampled RF signals so as to form an MR image.

4. An MRI apparatus as claimed in claim 1, the apparatus further comprising at least two pairs of coils, each of which comprising a first coil which has a sensitivity vector which is directed transversely of the physical plane of said first coil and a second coil which has a sensitivity vector which is directed substantially parallel to the physical plane of said second coil, said pairs of coils overlapping one another at least partly in space.

5. An MRI apparatus as claimed in claim 1, in which apparatus the imaging volume is situated in a tunnel-shaped bore and a whole-body RF coil is provided at the area of the wall of the bore,
   said apparatus comprising:
      means for forming a first MR image by means of the whole-body RF coil;
      means for forming a second MR image which is anatomically identical to the first MR image by sampling the RF signals received by the at least two RF receiving coils by means of the sub-sampling method; and
      means for comparing the mean intensity value of the pixels in a zone of the first MR image with the mean intensity value of pixels in a corresponding zone of the second MR image and for determining, on the basis of said comparison, the sensitivity function of the combination of the at least two RF receiving coils.

6. A method of forming MR images, using an MRI apparatus, of a patient to be examined in an imaging volume of the MRI apparatus, the method comprising the steps of:
   generating a uniform magnetic field in the imaging volume of the MRI apparatus;
   arranging the patient to be examined in the imaging volume so that the longitudinal axis thereof extends in the direction of the uniform magnetic field;
   arranging at least two RF receiving coils in the imaging volume and near the patient in order to receive RF signals originating from the patient, a first one of said RF receiving coils having a sensitivity vector which is directed transversely of the physical plane of said first coil; and
   sampling in a sub-sampling fashion the RF signals received by the RF receiving coils, wherein
   a second one of the at least two RF receiving coils is chosen so as to have a sensitivity vector which is directed substantially parallel to the physical plane of said second coil.

7. A method as claimed in claim 6, wherein the at least two RF receiving coils are arranged so as to overlap one another in space.

8. A method as claimed in claim 6, wherein at least two pairs of coils are fitted, each pair comprising a first coil which has a sensitivity vector which is directed transversely of the physical plane of the relevant first coil and a second coil which has a sensitivity vector which is directed substantially parallel to the physical plane of said second coil, said pairs of coils overlapping one another at least partly in space.

9. A method as claimed in claim 6, wherein the imaging volume is situated in a tunnel-shaped bore and a whole-body RF coil is provided at the area of the wall of the bore,
   wherein a first MR image is formed by means of the whole-body RF coil,
   wherein a second MR image which is anatomically identical to the first MR image is formed by sampling the RF signals received by the at least two RF receiving coils by means of the sub-sampling method, and
   wherein the mean intensity value of the pixels in a zone of the first MR image is compared with the mean intensity value of pixels in a corresponding zone of the second MR image and wherein the sensitivity function of the combination of the at least two RF receiving coils is determined on the basis of said comparison.

* * * * *